(12) United States Patent
Ning

(10) Patent No.: US 11,823,765 B2
(45) Date of Patent: Nov. 21, 2023

(54) STORAGE SYSTEM

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 28 days.

(21) Appl. No.: 17/594,774

(22) PCT Filed: Feb. 5, 2021

(86) PCT No.: PCT/CN2021/075393
§ 371 (c)(1),
(2) Date: Oct. 29, 2021

(87) PCT Pub. No.: WO2022/027946
PCT Pub. Date: Feb. 10, 2022

(65) Prior Publication Data
US 2022/0406345 A1 Dec. 22, 2022

(30) Foreign Application Priority Data

Aug. 3, 2020 (CN) .......................... 202010766451.1

(51) Int. Cl.
*G11C 7/10* (2006.01)
(52) U.S. Cl.
CPC .......... *G11C 7/1051* (2013.01); *G11C 7/1084* (2013.01); *G11C 2207/107* (2013.01)
(58) Field of Classification Search
CPC ................ G11C 7/1051; G11C 7/1084; G11C 2207/107
See application file for complete search history.

(56) References Cited

U.S. PATENT DOCUMENTS 4,961,010 A 10/1990 Davis
5,990,711 A 11/1999 Sekimoto
(Continued)

FOREIGN PATENT DOCUMENTS

CN 103066987 A 4/2013
CN 103744803 A 4/2014
(Continued)

OTHER PUBLICATIONS

Signal Line Driver and Semiconductor Memory Device Using the Same; Cho Il-Jae (Year: 1998).*
(Continued)

*Primary Examiner* — Sultana Begum
(74) *Attorney, Agent, or Firm* — Cooper Legal Group, LLC

(57) ABSTRACT

The present application provides a storage system including a data port. The data port includes a data output unit. The data output unit includes: a pull-up unit having a control terminal, a first terminal and a second terminal, a first input signal being inputted to the control terminal, the first terminal being electrically connected to a power supply, the second terminal being connected to an output terminal of the data output unit, and the pull-up unit being a first NMOS transistor; and a pull-down unit having a control terminal, a first terminal and a second terminal, a second input signal being inputted to the control terminal, the first terminal being electrically connected to a ground terminal, and the second terminal being connected to the output terminal of the data output unit.

15 Claims, 3 Drawing Sheets

(56) References Cited

U.S. PATENT DOCUMENTS

| | | |
|---|---|---|
| 6,445,211 B1 | 9/2002 | Saripella |
| 8,120,968 B2 | 2/2012 | Reohr et al. |
| RE47,312 E | 3/2019 | Moon |
| 2002/0186596 A1 | 12/2002 | Matsumoto |
| 2010/0110801 A1 | 5/2010 | Song |
| 2010/0329042 A1 | 12/2010 | Seong |
| 2011/0249511 A1 | 10/2011 | Song |
| 2013/0058155 A1* | 3/2013 | Callen ............... H01L 27/0207 365/154 |
| 2015/0269979 A1 | 9/2015 | Byeon |
| 2016/0105183 A1 | 4/2016 | Kim |
| 2017/0220090 A1* | 8/2017 | Kim .................. G06F 1/266 |
| 2018/0012647 A1 | 1/2018 | Ramamurthy et al. |
| 2018/0226108 A1 | 8/2018 | Kwon |
| 2018/0233179 A1 | 8/2018 | Hwang |
| 2019/0005991 A1 | 1/2019 | Kim |
| 2020/0227129 A1 | 7/2020 | Kim |

FOREIGN PATENT DOCUMENTS

| | | | |
|---|---|---|---|
| CN | 105515596 A | 4/2016 | |
| CN | 106160728 A | 11/2016 | |
| CN | 107230487 A | 10/2017 | |
| CN | 108428461 A | 8/2018 | |
| CN | 109346117 A | 2/2019 | |
| CN | 109741775 A | 5/2019 | |
| CN | 110660431 A | 1/2020 | |
| CN | 210606642 U | 5/2020 | |
| DE | 19812270 A1 * | 11/1998 | ........... G11C 7/1051 |
| EP | 2680441 A2 | 1/2014 | |
| KR | 19990004870 A | 1/1999 | |

OTHER PUBLICATIONS

International Search Report as cited in PCT Application No. PCT/CN2021/075455 dated Apr. 26, 2021, 4 pages.
International Search Report as cited in PCT Application No. PCT/CN2021/075393 dated Apr. 21, 2021, 5 pages.
Written Opinion cited in PCT/CN2021/075455, dated Apr. 26, 2021, 6 pages.
Written Opinion cited in PCT/CN2021/075393, dated Apr. 21, 2021, 7 pages.
Supplementary Partial European Search Report cited in EP21853076.4, dated Mar. 15, 2023, 14 pages.
Supplementary Partial European Search Report cited in EP21853579.7, dated Apr. 4, 2023, 13 pages.
First Office Action of the Chinese application No. 202010766270.9, dated May 26, 2023. 10 pages with English abstract.
Supplementary European Search Report in the European application No. 21853579.7, dated Jul. 6, 2023. 11 pages.
Supplementary European Search Report in the European application No. 21853076.4, dated Jul. 25, 2023. 13 pages.

\* cited by examiner

STORAGE SYSTEM

CROSS-REFERENCE TO RELATED APPLICATION

This application claims priority to Chinese Patent Application No. 202010766451.1, entitled "STORAGE SYSTEM" and filed on Aug. 3, 2020, the entire contents of which are incorporated herein by reference.

TECHNICAL FIELD

The present application relates to the field of semiconductor storage, in particular to a storage system.

BACKGROUND

A semiconductor storage system is a memory component configured to store various kinds of data information. Data input and output are generally needed between the semiconductor storage system and a control system. However, with the development of storage systems, users have increasingly higher requirements for a data transmission rate, and an existing data transmission rate cannot meet the requirements.

Therefore, it is an urgent problem to be solved currently to provide a storage system with a high transmission rate.

SUMMARY

The present application provides a storage system, including a data port, the data port including a data output unit, the data output unit including: a pull-up unit having a control terminal, a first terminal and a second terminal, a first input signal being inputted to the control terminal, the first terminal being electrically connected to a power supply, the second terminal being connected to an output terminal of the data output unit, and the pull-up unit being a first NMOS transistor; and a pull-down unit having a control terminal, a first terminal and a second terminal, a second input signal being inputted to the control terminal, the first terminal being electrically connected to a ground terminal, and the second terminal being connected to the output terminal of the data output unit.

Further, the pull-down unit is a second NMOS transistor.

Further, a width of the first NMOS transistor is greater than that of the second NMOS transistor.

Further, the data output unit further includes a first switch unit and a second switch unit, the first terminal of the pull-up unit is electrically connected to the power supply through the first switch unit, and the first terminal of the pull-down unit is electrically connected to the ground terminal through the second switch unit.

Further, the first switch unit is a first transistor, the first transistor includes a control terminal, a first terminal and a second terminal, an enable signal is inputted to the control terminal, the first terminal is electrically connected to the power supply, and the second terminal is electrically connected to the first terminal of the pull-up unit.

Further, the second switch unit is a second transistor, the second transistor includes a control terminal, a first terminal and a second terminal, the enable signal is inputted to the control terminal, the first terminal is electrically connected to the ground terminal, and the second terminal is electrically connected to the first terminal of the pull-down unit.

Further, the first transistor is a third NMOS transistor, and the second transistor is a fourth NMOS transistor.

Further, the first input signal and the second input signal are complementary signals.

Further, the data output unit further includes an inverter, and the first input signal is inputted to the control terminal of the pull-up unit through the inverter, or the second input signal is inputted to the control terminal of the pull-down unit through the inverter.

Further, a voltage corresponding to a high level of an output signal of the data output unit is less than a power supply voltage.

Further, the data port further includes a serializer, and data of the storage system, after parallel-to-serial conversion by the serializer, is inputted to the pull-up unit and the pull-down unit as the first input signal and the second input signal.

Further, the storage system includes a storage layer and a logical layer, and at least one of the storage layer and the logical layer has the data port.

Further, the data port further includes a data input unit, the data input unit being configured to receive data.

Further, the data input unit includes a buffer, and the data is inputted to the storage system through the buffer.

Further, the data port further includes a deserializer, and data outputted by the buffer, after serial-to-parallel conversion by the deserializer, is inputted to the storage system.

Further, the data input unit includes: a third switch unit; a fourth switch unit; a pull-up unit having a control terminal, a first terminal and a second terminal, the first input signal being inputted to the control terminal, the first terminal being electrically connected to the power supply through the third switch unit, the second terminal being connected to an output terminal of the data input unit, and the pull-up unit being an NMOS transistor; and a pull-down unit having a control terminal, a first terminal and a second terminal, the second input signal being inputted to the control terminal, the first terminal being electrically connected to the ground terminal through the fourth switch unit, and the second terminal being connected to the output terminal of the data input unit.

DESCRIPTION OF EMBODIMENTS

Embodiments of the storage system according to the present application are described in detail below with reference to the accompanying drawings.

Figure 1:
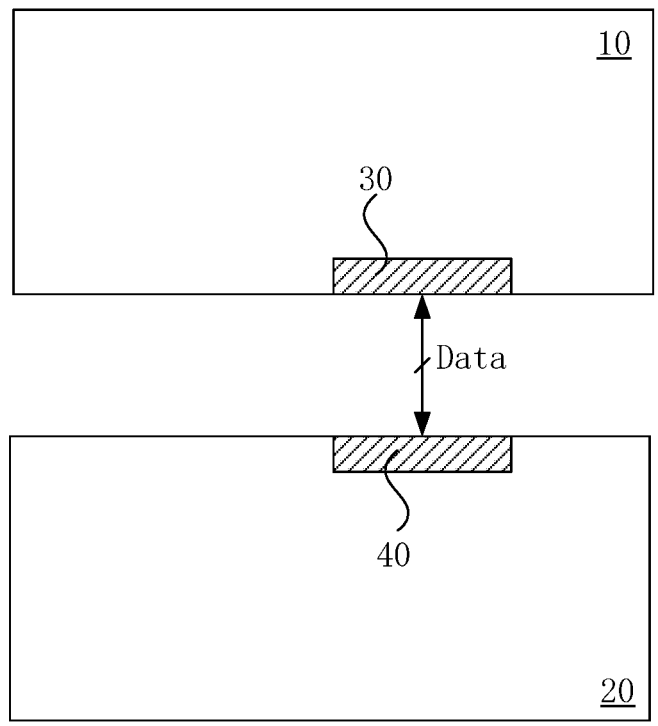
FIG. 1 is a structural diagram of a framework of an embodiment of a storage system according to the present application.

FIG. 1 is a schematic diagram of a framework of an embodiment of a storage system according to the present application. Referring to FIG. 1, the storage system according to the present application includes a storage layer 10 and a logical layer 20. The storage layer 10 and the logical layer 20 are each provided with a data port configured to receive and transmit data. Specifically, the storage layer 10 is provided with a data port 30, and the logical layer 20 is provided with a data port 40. The data port 30 is electrically connected to the data port 40, so that the storage layer 10 and the logical layer 20 transmit data through the data port 30 and the data port 40.

Figure 2:
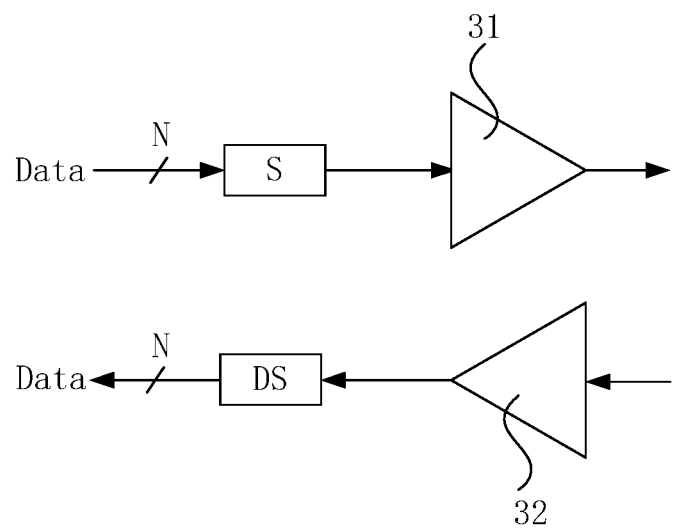
FIG. 2 is a schematic structural diagram of a data port arranged on a storage layer of the storage system.

FIG. 2 is a schematic structural diagram of the data port 30 arranged on the storage layer 10. Referring to FIG. 2, in this embodiment, the data port 30 arranged on the storage layer 10 includes a data output unit 31. Data of the storage layer 10 is transmitted externally through the data output unit 31, for example, to the logical layer 20. Further, the data port 30 further includes a data input unit 32. External data is transmitted through the data input unit 32 to the storage layer 10. In this embodiment, the data input unit 32 includes a buffer, and the external data (for example, data of the logical layer 20) is inputted to the storage system through the buffer.

Further, in this embodiment, the storage system further includes a serializer S, and data of the storage system, after parallel-to-serial conversion by the serializer S, is inputted to the data output unit 31 as an input signal. The storage system further includes a deserializer DS, and data outputted by the buffer, after serial-to-parallel conversion by the deserializer DS, is inputted to the storage system.

Figure 3:
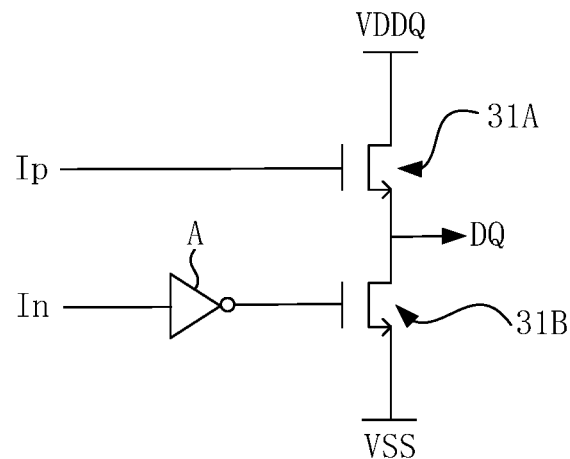
FIG. 3 is a schematic diagram of a circuit structure of a first embodiment of a data output unit of the storage system.

FIG. 3 is a schematic diagram of a circuit structure of a first embodiment of the data output unit 31. Referring to FIG. 3, the data output unit 31 includes a pull-up unit 31A and a pull-down unit 31B.

The pull-up unit 31A has a control terminal, a first terminal and a second terminal. A first input signal of the storage layer 10 is inputted to the control terminal, the first terminal is electrically connected to a power supply VDDQ, and the second terminal is connected to an output terminal DQ of the data output unit 31. The output terminal DQ is electrically connected to an external structure; for example, the output terminal DQ is electrically connected to the logical layer 20 to transmit data from the storage layer 10 to the logical layer 20. The pull-up unit is a first NMOS transistor. In the first NMOS transistor, a gate terminal is the control terminal, one of a source terminal and a drain terminal is the first terminal, and the other of the source terminal and the drain terminal is the second terminal.

The pull-down unit 31B has a control terminal, a first terminal and a second terminal. A second input signal of the storage layer 10 is inputted to the control terminal, the first terminal is electrically connected to a ground terminal VSS, and the second terminal is connected to the output terminal DQ of the data output unit. In this embodiment, the pull-down unit 31B and the pull-up unit 31A are transistors of the same type. That is, the pull-down unit 31B is a second NMOS transistor. In the second NMOS transistor, a gate terminal is the control terminal, one of a source terminal and a drain terminal is the first terminal, and the other of the source terminal and the drain terminal is the second terminal.

In this embodiment, the first input signal and the second input signal are complementary signals. For example, the first input signal is a positive input signal Ip, the second input signal is a negative input signal In, and they are complementary to each other, so as to output a complete signal at the output terminal DQ.

Further, the data output unit 31 further includes an inverter A. The first input signal is inputted to the control terminal of the pull-up unit 31A through the inverter A, or the second input signal is inputted to the control terminal of the pull-down unit 31B through the inverter A. In this embodiment, the first input signal and the second input signal are complementary signals, the pull-up unit 31A is an NMOS transistor, and the pull-down unit 31B is also an NMOS transistor; therefore, in order to ensure the integrity of an output signal, one of the pull-up unit 31A and the pull-down unit 31B is provided with the inverter A, so as to guarantee the integrity of the signal outputted by the output terminal DQ. In this embodiment, the inverter A is arranged on a branch where the pull-down unit 31B is located; that is, the second input signal is inputted to the control terminal of the pull-down unit 31B through the inverter A. No inverter is arranged on a branch where the pull-up unit 31A is located; that is, the first input signal is directly inputted to the control terminal of the pull-up unit 31A. In other embodiments of the present application, an inverter may be arranged on the branch where the pull-up unit 31A is located, while no inverter is arranged on the branch where the pull-down unit 31B is located.

Further, in this embodiment, a voltage corresponding to a high level of an output signal of the output terminal DQ of the data output unit 31 is less than a power supply voltage VDDQ. That is, a voltage of the output terminal DQ is not required to be increased to the power supply voltage VDDQ, which reduces the time of conversion between a low level and a high level and increases a data transmission rate.

Further, a width of the first NMOS transistor is greater than that of the second NMOS transistor, and the first NMOS transistor and the second NMOS transistor operate in a linear region, which can further increase the data transmission rate and improve the performance of the storage system.

The data output unit of the storage system according to the present application is provided with the pull-up unit 31A and the pull-down unit 31B, wherein the pull-up unit 31A is an NMOS transistor, so that a voltage of the data output unit can be effectively accelerated from low to high or from high to low; that is, the time of conversion of the voltage of the data output unit from low to high or from high to low is reduced, thereby increasing the data transmission speed and improving the performance of the storage system.

Figure 4:
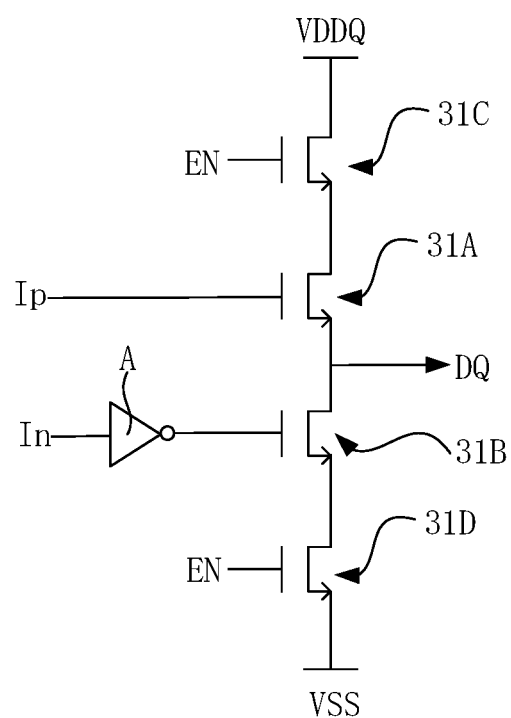
FIG. 4 is a schematic diagram of a circuit structure of a second embodiment of the data output unit of the storage system.

A second embodiment of the data output unit 31 is further provided for the storage system according to the present application. FIG. 4 is a schematic diagram of a circuit structure of a second embodiment of the data output unit 31. Referring to FIG. 4, the data output unit 31 not only includes the pull-up unit 31A and the pull-down unit 31B, but also includes a first switch unit 31C and a second switch unit 31D.

The first terminal of the pull-up unit 31A is electrically connected to the power supply VDDQ through the first switch unit 31C, and the first terminal of the pull-down unit 31B is electrically connected to the ground terminal VSS through the second switch unit 31D. In the present application, the data output unit 31 can be switched between output of data and a high-impedance state (that is, no output of data) by turning on and turning off the first switch unit 31C and the second switch unit 31D. Specifically, when the first switch unit 31C and the second switch unit 31D are turned on, the data output unit 31 can output data; and when the first switch unit 31C and the second switch unit 31D are turned off, the data output unit 31 cannot output data and presents the high-impedance state.

Further, in this embodiment, the first switch unit 31C is a first transistor. The first transistor includes a control terminal, a first terminal and a second terminal. An enable signal EN is inputted to the control terminal to control ON and OFF of the first switch unit 31C. The first terminal is electrically connected to the power supply VDDQ. The second terminal is electrically connected to the first terminal of the pull-up unit 31A. In this embodiment, the first transistor is a third NMOS transistor. In the third NMOS transistor, a gate terminal is the control terminal, one of a source terminal and a drain terminal is the first terminal, and the other of the source terminal and the drain terminal is the second terminal. In other embodiments of the present application, the first transistor may also be a PMOS transistor. In the PMOS transistor, a gate terminal is the control terminal, one of a source terminal and a drain terminal is the first terminal, and the other of the source terminal and the drain terminal is the second terminal.

Further, in this embodiment, the second switch unit 31D is a second transistor. The second transistor includes a control terminal, a first terminal and a second terminal. The enable signal EN is inputted to the control terminal to control ON and OFF of the second switch unit 31D. The first terminal is electrically connected to the ground terminal VSS. The second terminal is electrically connected to the first terminal of the pull-down unit 31B. In this embodiment, the second transistor is a fourth NMOS transistor. In the fourth NMOS transistor, a gate terminal is the control terminal, one of a source terminal and a drain terminal is the first terminal, and the other of the source terminal and the drain terminal is the second terminal. In other embodiments of the present application, the second transistor may also be a PMOS transistor. In the PMOS transistor, a gate terminal is the control terminal, one of the source terminal and the drain terminal is the first terminal, and the other of the source terminal and the drain terminal is the second terminal.

Figure 5:
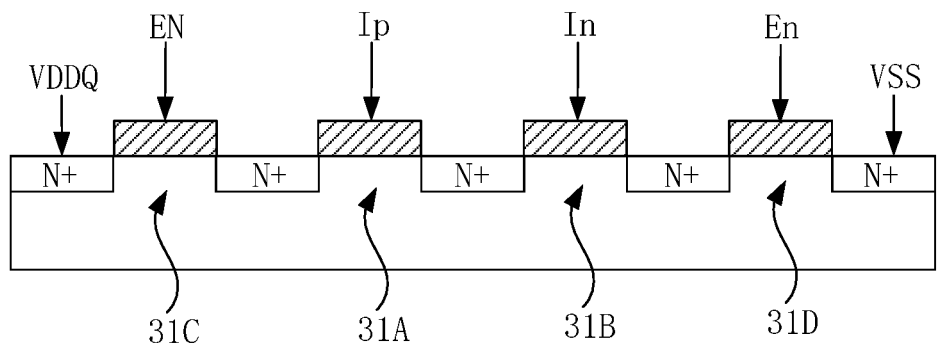
FIG. 5 is a structural diagram of a process of the data output unit of the storage system.

In this embodiment, the pull-up unit 31A, the pull-down unit 31B, the first switch unit 31C and the second switch unit 31D are all NMOS transistors and may share a semiconductor structure, which greatly simplifies the layout and saves a manufacturing process. Specifically, refer to FIG. 5, which is a structural diagram of a process of the data output unit 31.

The power supply VDDQ is electrically connected to the first terminal of the first switch unit 31C, a common region exists between the first switch unit 31C and the pull-up unit 31A, which acts as the second terminal of the first switch unit 31C and the first terminal of the pull-up unit 31A, and the enable signal EN is inputted to the gate terminal of the first switch unit 31C.

A common region exists between the pull-up unit 31A and the pull-down unit 31B, which acts as the second terminal of the pull-up unit 31A and the second terminal of the pull-down unit 31B, and the first input signal is inputted to the gate terminal of the pull-up unit 31A.

A common region exists between the pull-down unit 31B and the second switch unit 31D, which acts as the first terminal of the pull-down unit 31B and the second terminal of the second switch unit 31D, and the second input signal is inputted to the gate terminal of the pull-down unit 31B after passing through the inverter.

The ground terminal VSS is electrically connected to the first terminal of the second switch unit 31D, and the enable signal EN is inputted to the gate terminal of the second switch unit 31D.

In the above embodiment of the present application, the data input unit 32 is a buffer. In another embodiment of the present application, the data input unit 32 is of the same structure as the data output unit 31.

Figure 6:
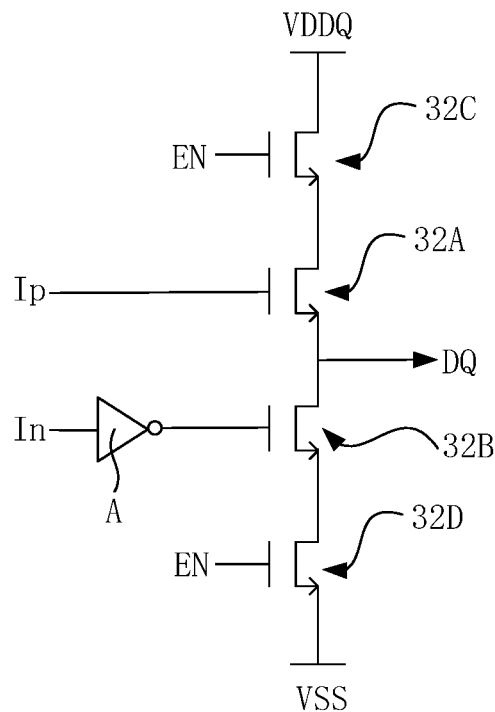
FIG. 6 is a schematic diagram of a circuit structure of an embodiment of a data input unit of the storage system according to the present application.

Specifically, refer to FIG. 6, which is a schematic diagram of a circuit structure of an embodiment of the data input unit 32 of the storage system according to the present application. The data input unit 32 includes a pull-up unit 32A, a pull-down unit 32B, a third switch unit 32C and a fourth switch unit 32D.

The pull-up unit 32A has a control terminal, a first terminal and a second terminal. The first input signal of the external structure (for example, the logical layer 20) is inputted to the control terminal, the first terminal is electrically connected to the power supply VDDQ through the third switch unit 32C, and the second terminal is connected to an output terminal DQ of the data input unit 32. The signal of the output terminal DQ is inputted to the storage layer 10. In this embodiment, the pull-up unit 32A is an NMOS transistor.

The pull-down unit 32B has a control terminal, a first terminal and a second terminal. The second input signal of the external structure (for example, the logical layer 20) is inputted to the control terminal, the first terminal is electrically connected to the ground terminal VSS through the fourth switch unit 32D, and the second terminal is connected to the output terminal DQ of the data input unit. In this embodiment, the pull-down unit 32B is an NMOS transistor. In other embodiments of the present application, the pull-down unit 32B may also be a PMOS transistor.

The first input signal and the second input signal are complementary signals. For example, the first input signal is a positive input signal Ip, the second input signal is a negative input signal In, and they are complementary to each other, so as to output a complete signal at the output terminal DQ.

The data input unit of the storage layer 10 of the storage system according to the present application is provided with the pull-up unit 32A and the pull-down unit 32B, and the pull-up unit 32A is an NMOS transistor, so that a voltage of the data input unit can be effectively accelerated from low to high or from high to low; that is, the time of conversion of the voltage of the data input unit from low to high or from high to low is reduced, thereby greatly increasing the data transmission speed and improving the performance of the storage system.

In the present application, the data input unit 32 can be switched between input of data and a high-impedance state (that is, no input of data) by turning on and turning off the third switch unit 32C and the fourth switch unit 32D. Specifically, when the third switch unit 32C and the fourth switch unit 32D are turned on, the data input unit 32 can input data; and when the third switch unit 32C and the fourth switch unit 32D are turned off, the data input unit 32 cannot input data and presents the high-impedance state.

Further, in this embodiment, the third switch unit 32C and the fourth switch unit 32D are both NMOS transistors, and then the pull-up unit 32A, the pull-down unit 32B, the third switch unit 32C and the fourth switch unit 32D can share a semiconductor structure with one another, which greatly simplifies the layout and saves the manufacturing process.

The structure of the data port 30 in the storage layer 10 is described in the above embodiments. It may be understood that the data port 40 located in the logical layer 20 may have the same structure as the data port 30 located in the storage layer 10. That is, the data output unit of the data port 40 located in the logical layer 20 may also consist of a pull-up unit and a pull-down unit, thereby greatly increasing a rate at which data is transmitted from the logical layer 20 to the storage layer 10 or other structural layers. The data input unit of the data port 40 located in the logical layer 20 may also consist of a pull-up unit and a pull-down unit, thereby greatly increasing a rate at which data is transmitted from the external structure (such as the storage layer or other structural layers) to the logical layer 20.

The above descriptions are only preferred implementations of the present application. It should be pointed out that, those of ordinary skill in the art may further make several improvements and modifications without departing from the principle of the present application. Such improvements and modifications should also fall within the protection scope of the present application.

What is claimed is:

1. A storage system, comprising a data port, the data port comprising a data output unit, the data output unit comprising:
    a pull-up unit having a control terminal, a first terminal and a second terminal, a first input signal being inputted to the control terminal, the first terminal being electrically connected to a power supply, the second terminal being connected to an output terminal of the data output unit, and the pull-up unit being a first n-type metal-oxide semiconductor (NMOS) transistor; and
    a pull-down unit having a control terminal, a first terminal and a second terminal, a second input signal being inputted to the control terminal, the first terminal being electrically connected to a ground terminal, and the second terminal being connected to the output terminal of the data output unit,
    wherein the storage system further comprises a storage layer and a logical layer, each of the storage layer and the logical layer has the data port located thereon, and the data port on the logical layer has the same structure as the data port on the storage layer.

2. The storage system according to claim 1, wherein the pull-down unit is a second NMOS transistor.

3. The storage system according to claim 2, wherein a width of the first NMOS transistor is greater than that of the second NMOS transistor.

4. The storage system according to claim 1, wherein the data output unit further comprises a first switch unit and a second switch unit, the first terminal of the pull-up unit is electrically connected to the power supply through the first switch unit, and the first terminal of the pull-down unit is electrically connected to the ground terminal through the second switch unit.

5. The storage system according to claim 4, wherein the first switch unit is a first transistor, the first transistor comprises a control terminal, a first terminal and a second terminal, an enable signal is inputted to the control terminal, the first terminal is electrically connected to the power supply, and the second terminal is electrically connected to the first terminal of the pull-up unit.

6. The storage system according to claim 5, wherein the second switch unit is a second transistor, the second transistor comprises a control terminal, a first terminal and a second terminal, the enable signal is inputted to the control terminal, the first terminal is electrically connected to the ground terminal, and the second terminal is electrically connected to the first terminal of the pull-down unit.

7. The storage system according to claim 6, wherein the first transistor is a third NMOS transistor, and the second transistor is a fourth NMOS transistor.

8. The storage system according to claim 1, wherein the first input signal and the second input signal are complementary signals.

9. The storage system according to claim 8, wherein the data output unit further comprises an inverter, and the first input signal is inputted to the control terminal of the pull-up unit through the inverter, or the second input signal is inputted to the control terminal of the pull-down unit through the inverter.

10. The storage system according to claim 1, wherein a voltage corresponding to a high level of an output signal of the data output unit is less than a power supply voltage.

11. The storage system according to claim 1, wherein the data port further comprises a serializer, and data of the storage system, after parallel-to-serial conversion by the serializer, is inputted to the pull-up unit and the pull-down unit as the first input signal and the second input signal.

12. The storage system according to claim 1, wherein the data port further comprises a data input unit, the data input unit being configured to receive data.

13. The storage system according to claim 12, wherein the data input unit comprises a buffer, and the data is inputted to the storage system through the buffer.

14. The storage system according to claim 13, wherein the data port further comprises a deserializer, and data outputted by the buffer, after serial-to-parallel conversion by the deserializer, is inputted to the storage system.

15. The storage system according to claim 12, wherein the data input unit comprises:
    a third switch unit;
    a fourth switch unit;
    a second pull-up unit having a control terminal, a first terminal and a second terminal, the first input signal being inputted to the control terminal, the first terminal being electrically connected to the power supply through the third switch unit, the second terminal being connected to an output terminal of the data input unit, and the pull-up unit being a third NMOS transistor; and
    a second pull-down unit having a control terminal, a first terminal and a second terminal, the second input signal being inputted to the control terminal, the first terminal being electrically connected to the ground terminal through the fourth switch unit, and the second terminal being connected to the output terminal of the data input unit.

* * * * *